US006529000B2

(12) United States Patent
Lou

(10) Patent No.: US 6,529,000 B2
(45) Date of Patent: Mar. 4, 2003

(54) METHOD AND SYSTEM FOR PROCESSING MAGNETIC RESONANCE SIGNALS TO REMOVE TRANSIENT SPIKE NOISE

(75) Inventor: Xiaoming Lou, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 33 days.

(21) Appl. No.: 09/751,729

(22) Filed: Dec. 29, 2000

(65) Prior Publication Data

US 2002/0087063 A1 Jul. 4, 2002

(51) Int. Cl.[7] ................................................ G01V 3/00
(52) U.S. Cl. .................... 324/309; 324/322; 324/318
(58) Field of Search ................................. 324/322, 318, 324/309, 307, 300, 314, 316; 600/484, 407, 508, 509; 128/901

(56) References Cited

U.S. PATENT DOCUMENTS

| 4,796,638 A | * | 1/1989 | Sasaki ........................ 600/509 |
| 4,952,877 A | * | 8/1990 | Stormont et al. ........... 324/312 |
| 4,992,736 A | * | 2/1991 | Stormont et al. ........... 324/309 |
| 5,038,785 A | * | 8/1991 | Blakeley et al. ............ 600/484 |
| 5,525,906 A | | 6/1996 | Crawford et al. ........... 324/322 |
| 2002/0087063 A1 | * | 7/2002 | Lou ............................ 600/410 |

OTHER PUBLICATIONS

Scherg et al., Multiple source analysis of interictal spikes: Goals, requirements and Clinical Value. Journal of Clinical Neurophysiology (J. Clin. Neurophysiol.) (United States) 1999, 16/3 (214–224).*

* cited by examiner

Primary Examiner—Edward Lefkowitz
Assistant Examiner—Tiffany A. Fetzner
(74) Attorney, Agent, or Firm—Quarles & Brady LLP; Carl Horton

(57) ABSTRACT

A method and apparatus is disclosed for processing, in a magnetic resonance imaging system, a magnetic resonance signal including transient spike noise. The method includes receiving an initial signal related to the magnetic resonance signal, the initial signal including a carrier signal modulated by a modulation signal and further including a transient spike noise component. The method further includes determining an envelope signal indicative of an envelope of the initial signal, such that the envelope is indicative of the modulation signal and further indicative of the transient spike noise component. The method additionally includes filtering the envelope signal by way of a high-pass filter to remove information relating to the modulation signal from the envelope signal and to produce a filtered envelope signal indicative of the transient spike noise component. The method further includes comparing a comparison signal related to the filtered envelope signal with a threshold to produce a noise indication signal, and modifying the magnetic resonance signal based upon the noise indication signal.

20 Claims, 3 Drawing Sheets

METHOD AND SYSTEM FOR PROCESSING MAGNETIC RESONANCE SIGNALS TO REMOVE TRANSIENT SPIKE NOISE

BACKGROUND OF THE INVENTION

The field of the invention is nuclear magnetic resonance imaging (MRI) methods and systems. More particularly, the invention relates to a method and system for processing nuclear magnetic resonance (NMR) signals acquired during a scan in order to remove transient spike noise from the NMR signals and thereby eliminate artifacts produced by such noise in the reconstructed image.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to an additional magnetic field (excitation field B.) which is in the x-y plane and which is near the Larmor frequency, the net aligned moment, $M_z$, may be rotated, or "tipped", into the x-y plane to produce a net transverse magnetic moment $M_t$. A radio-frequency (RF) signal, which is also denoted the nuclear magnetic resonance (NMR) signal, is emitted by the excited spins after the excitation signal $B_1$ is terminated, and this NMR signal may be received and processed to form an image.

MRI scanners include a large magnet assembly for producing the uniform polarizing field $B_0$ in a bore which is large enough to receive a patient. An RF coil surrounds the patient and is switched between a transmitter and receiver to produce the excitation field B, and to receive the resulting NMR signal. Additionally, three sets of gradient coils surround the RF coil to produce magnetic field gradients $G_x$, $G_y$ and $G_z$, and a shield is disposed therebetween to isolate the RF coil so that its uniform field is not disrupted. Typically, the region to be imaged is scanned by a sequence of measurement cycles in which the magnetic field gradients are switched on and off according to the particular localization method being used. The resulting set of received NMR signals are digitized and processed to reconstruct the image using one of many well known reconstruction techniques.

The NMR signals are very small and extraordinary measures are taken to shield the MRI system from external RF noise and to eliminate sources of internal noise. Nevertheless, generators of short-duration noise pulses persist and may elude location and elimination. These noise pulses are referred to as "spike noise", "impulse noise" or "white pixels", and lead to image artifacts with such vernacular names as corduroy and zebra artifacts. Sources of such noise include arcing due to partial discharges from intermittent electrical contacts or electrostatic discharge, and harmonics of fast transients such as those caused by ground loops. When such noise sources occur regularly, their source can be located and measures can be taken to eliminate them. This "hardening" process occurs at any new MRI installation, and eventually all the short-duration noise sources are eliminated except those which are intermittent and defy cost-effective diagnosis.

A number of strategies have been employed to mitigate the effects of intermittent noise sources. Such methods include the examination of the acquired NMR signals to locate noise spikes or the examination of the reconstructed image to locate the effects of such noise. These prior methods work when the noise spike occurs in NMR signals that are heavily phase or frequency encoded (i.e. on the edges of k-space), but they do not perform well when the noise spike occurs in NMR signals near the center of k-space. In the latter case the NMR signal magnitude is quite large and it is more difficult to discern signal from noise. Noise spikes detected by such methods are sometimes removed by interpolating between the adjacent values.

Another strategy, which is more effective in detecting and eliminating short-duration noise spikes near the center of k-space, was disclosed in U.S. Pat. No. 5,525,906 entitled "Detection and Elimination of Wide Bandwidth Noise in MRI Signals." In that strategy, the NMR signal is processed by a noise filter or Transient Noise Suppression (TNS) system that includes a noise detector. The noise detector has a bandstop filter that is tuned to stop the NMR signals but to pass a range of frequencies outside the NMR imaging frequency band that include at least some of the spike noise. Because a considerable portion of the energy of short-duration spikes is located outside of the NMR imaging frequency band, the bandstop filter effectively isolates the spike noise from the NMR imaging frequency information. The bandstop filter thus provides an output signal that is an indication of the level of spike noise independent of the NMR imaging frequency information.

The magnitude of the output signal from the bandstop filter is then compared with a noise reference level at a comparator. When the magnitude of the output signal exceeds the noise reference level, a noise indication signal is produced (or is changed in its level) indicating that there is noise due to short-duration spikes. The noise indication signal can then be used to eliminate noise from the entire NMR signal by blanking out portions of the NMR signal whenever noise is detected, before the NMR signal is provided to an image reconstructor.

Although TNS systems are more effective at eliminating noise due to short-duration spikes near the center of k-space than the other systems mentioned above, TNS systems are highly frequency dependent. In particular, the stop band of the bandstop filter in a TNS system must be carefully set so that the filter passes the ranges of frequencies above and below the NMR imaging frequency band and not the NMR imaging frequency band itself. If the pass band of the bandstop filter encompasses the NMR imaging frequency band, the TNS system may mistake the high-magnitude signal components containing the imaging information for high-magnitude noise spikes, and inappropriately blank out portions of the NMR signal that contain useful information rather than noise. The high sensitivity of TNS systems to frequency is undesirable insofar as TNS systems must as a result be carefully and accurately implemented in order for the systems to properly remove noise due to short-duration spikes.

The high frequency sensitivity of TNS systems is also undesirable because it makes it necessary to configure a TNS system differently depending upon the frequency of operation of the MRI system (particularly the frequency of the polarizing field $B_0$) in which it is implemented. Given the wide variety of MRI systems, and given that some MRI systems can operate at a variety of different frequencies, TNS systems must be repeatedly configured. Given that the tuning of TNS systems to MRI systems, and performance verification, can be costly, the high frequency sensitivity of TNS systems increases the cost of systems overall and places an undesirable constraint on the design of new MRI systems, particularly those that operate at multiple frequencies.

It would therefore be advantageous if a system could be developed for eliminating noise due to short-duration spikes from NMR signals and thereby mitigating the appearance of undesirable image artifacts from images created by MRI systems. It would particularly be advantageous if such a system could be developed that was successful in eliminating noise due to short-duration spikes even where the spikes were near the center of k-space. It would additionally be advantageous if such a system was not overly frequency sensitive in its operation, such that it could be easily implemented in a variety of MRI systems having a variety of frequencies of operation, or in MRI systems that operated at multiple frequencies of operation. It would further be advantageous if the system was low in cost and could be easily implemented.

BRIEF SUMMARY OF THE INVENTION

The present invention relates to, in a magnetic resonance imaging system, a method of processing a magnetic resonance signal including transient spike noise. The method includes receiving an initial signal related to the magnetic resonance signal, the initial signal including a carrier signal modulated by a modulation signal and further including a transient spike noise component. The method further includes determining an envelope signal indicative of an envelope of the initial signal, such that the envelope is indicative of the modulation signal and further indicative of the transient spike noise component. The method additionally includes filtering the envelope signal by way of a high-pass filter to remove information relating to the modulation signal from the envelope signal and to produce a filtered envelope signal indicative of the transient spike noise component. The method further includes comparing a comparison signal related to the filtered envelope signal with a threshold to produce a noise indication signal, and modifying the magnetic resonance signal based upon the noise indication signal.

The present invention also relates to a method of processing a magnetic resonance signal including transient spike noise, in a magnetic resonance imaging system. The method includes receiving an initial signal related to the magnetic resonance signal, where the initial signal includes a carrier signal modulated by a modulation signal and further includes a transient spike noise component. The method additionally includes determining an envelope signal indicative of an envelope of the initial signal, such that the envelope is indicative of the modulation signal and further indicative of the transient spike noise component. The method also includes filtering the envelope signal by way of a filter to remove information relating to the modulation signal from the envelope signal and to produce a filtered envelope signal indicative of the transient spike noise component. The method further includes processing the magnetic resonance signal based upon the filtered envelope signal.

The present invention additionally relates to, in a magnetic resonance imaging system, a system for processing a magnetic resonance signal having a transient spike noise component. The system includes an envelope detector that receives an initial signal related to a magnetic resonance signal and provides an envelope signal in response to the initial signal. The system further includes a high-pass filter that is coupled to the envelope detector, receives the envelope signal and provides a filtered envelope signal in response to the envelope signal. The high-pass filter isolates signal components corresponding to transient spike noise in the initial signal from signal components corresponding to magnetic resonance imaging information in the initial signal. The system additionally includes a comparison device that is coupled to the high-pass filter, receives a comparison signal related to the filtered envelope signal and provides a noise indication signal based upon the filtered envelope signal. The system further includes a modification device that is coupled to the comparison device and modifies the magnetic resonance signal based upon the noise indication signal, in order to reduce the transient spike noise component in the magnetic resonance signal and produce an improved magnetic resonance signal.

The present invention additionally relates to a magnetic resonance imaging system. The system includes an operator console, a computer system coupled to the operator console and including a memory, a system control coupled to the computer system and including a transceiver, and a magnet assembly coupled to the system control that produces varying magnetic fields as determined by the system control. The transceiver receives a magnetic resonance signal from the magnet assembly, detects an envelope of an initial signal related to the magnetic resonance signal to produce an envelope signal, and filters the envelope signal to isolate a transient spike noise component of the envelope signal and produce a filtered envelope signal indicative of the transient spike noise component. The transceiver further processes the magnetic resonance signal based upon the filtered envelope signal to eliminate transient spike noise from the magnetic resonance signal and to produce an improved magnetic resonance signal.

DESCRIPTION OF THE PREFERRED EMBODIMENT

Figure 1:
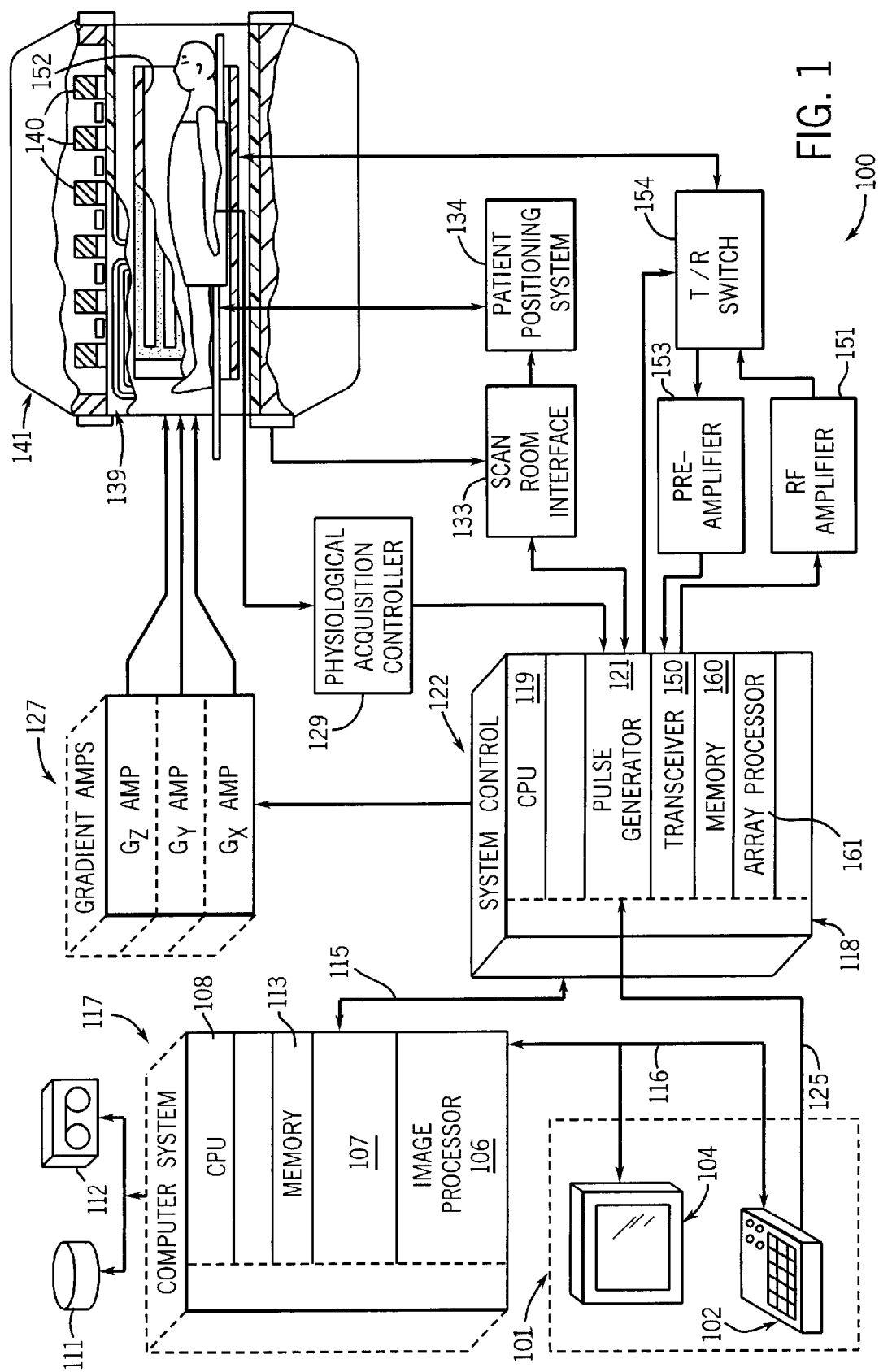
FIG. 1 is a block diagram of an MRI system which employs the present invention.

Referring first to FIG. 1, there is shown the major components of a preferred MRI system 100 that incorporates the present invention. The operation of the MRI system 100 is controlled from an operator console 101 which includes a keyboard and control panel 102 and a display 104. The console 101 communicates through a link 116 with a separate computer system 107 that enables an operator to control the production and display of images on the display 104. The computer system 107 includes a number of modules which communicate with each other through a backplane 117. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate MRI system control 122 through a high speed serial link 115.

The system control 122 includes a set of modules connected together by an additional backplane 118. These include a CPU module 119 and a pulse generator module 121, which connects to the operator console 101 through a serial link 125. It is through this link 125 that the system control 122 receives commands from the operator that indicate the scan sequence to be performed. The pulse generator module 121 operates the system components to carry out the desired scan sequence. It produces data that indicates the timing, strength and shape of the RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 that receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF power amplifier 151 and coupled to the RF coil 152 by a transmit/receive switch 154.

The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF power amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 101, this image data may be archived on the tape drive 112, or it may be further processed by the image processor 106 and conveyed to the operator console 101 and presented on the display 104.

Figure 2:
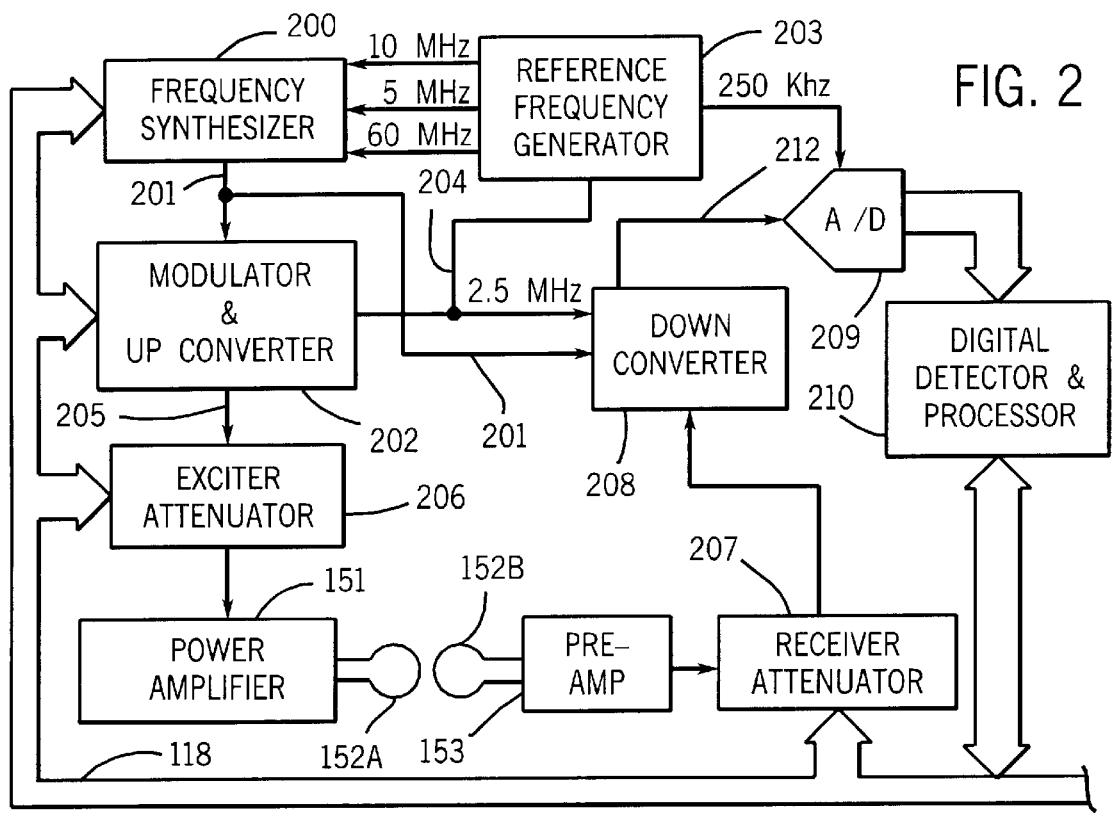
FIG. 2 is an electrical block diagram of a transceiver which forms part of the MRI system of FIG. 1.

Referring particularly to FIGS. 1 and 2, the transceiver 150 produces the RF excitation field B₁ through the RF power amplifier 151 at a coil 152A and receives the resulting signal induced in a coil 152B. As indicated above, the coils 152A and B may be separate as shown in FIG. 2, or may be a single wholebody coil as shown in FIG. 1. The base, or carrier, frequency of the RF excitation field is produced under control of a frequency synthesizer 200, which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal also received from the pulse generator module 121. This signal defines the envelope of the RF excitation pulse to be produced and is produced in the module 121 by sequentially reading out a series of stored digital values. These stored digital values may, in turn, be changed from the operator console 101 to enable any desired RF pulse envelope to be produced. The magnitude of the RF excitation pulse produced at output 205 is attenuated by an exciter attenuator circuit 206 that receives a digital command (TA) from the backplane 118. The attenuated RF excitation pulses are applied to the RF power amplifier 151 that drives the RF coil 152A. For a more detailed description of this portion of the transceiver 122, reference is made to U.S. Pat. No. 4,952,877, which is incorporated herein by reference.

Referring still to FIGS. 1 and 2, the NMR signal produced by the subject is picked up by the receiver coil 152B and applied through the preamplifier 153 to the input of a receiver attenuator 207. This NMR signal typically occupies a bandwidth of less than one megahertz (MHz), centered on the Larmor frequency of the spin species being imaged. In a 1.5 Tesla system imaging hydrogen, for example, the Larmor frequency is 63.86 MHz. The receiver attenuator 207 further modifies the amplitude of this NMR signal by an amount determined by a digital attenuation signal (RA) received from the backplane 118. In addition, the receiver attenuator 207 includes a new Transient Noise Suppression (TNS) system or noise filter 300 (shown in FIG. 3), which practices the present invention and which will be described in detail below with reference to FIGS. 3 and 4.

The received NMR signal is at or around the Larmor frequency, and this high frequency signal is down converted in a two step process by a down converter 208. The down converter 208 first mixes the NMR signal with the carrier signal on output 201 and then mixes the resulting difference signal with the 2.5 MHz reference signal on line 204. The down converted NMR signal 212 is applied to the input of an analog-to-digital (A/D) converter 209 that samples and digitizes the analog signal. The digitized samples are applied to a digital detector and signal processor 210 which produces 16-bit in-phase (I) values and 16-bit quadrature (Q) values corresponding to the received signal. The resulting stream of digitized I and Q values of the received signal are output through the backplane 118 to the memory module 160 where they are employed to reconstruct an image.

The 2.5 MHz reference signal of line 204, as well as a 250 kHz sampling signal used to control the sampling of the A/D converter 209 and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
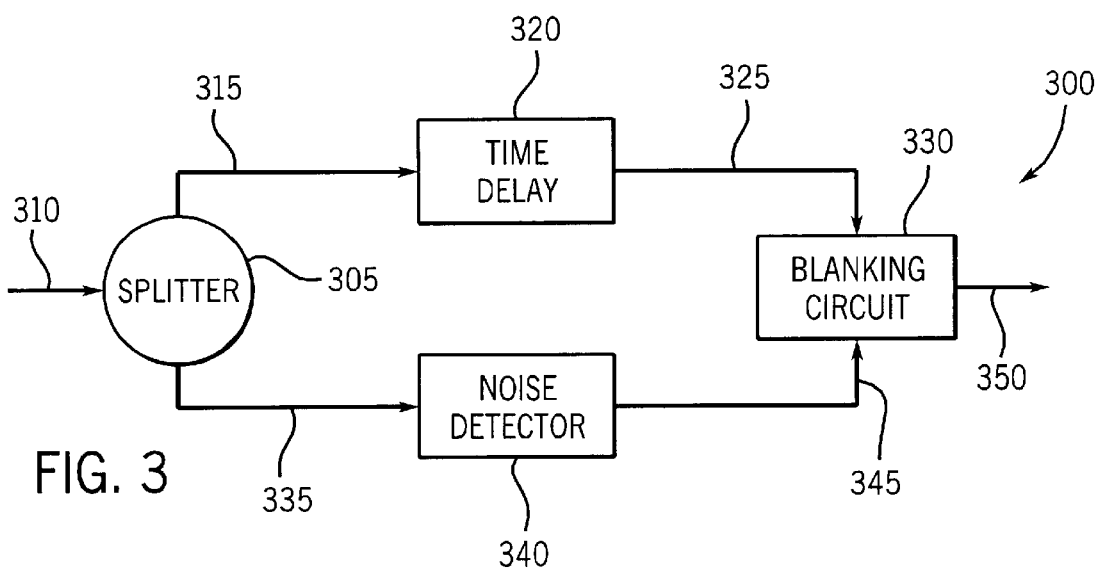
FIG. 3 is an electrical block diagram of a TNS system that forms part of the transceiver of FIG. 2.

Referring particularly to FIG. 3, the preferred embodiment of the noise filter 300 of receiver attenuator 207, in accordance with the present invention, receives the acquired NMR signal at an input 310 from the pre-amp 153. The NMR signal is split at a splitter 305 and is applied through a line 335 to a noise detector 340 and through a line 315 to a time delay circuit 320. As will be explained in more detail below, the noise detector 340 senses the presence of any short-duration noise spikes in the NMR signal and produces a noise indication signal on line 345. The noise indication signal has a duration which is coincident with the short-duration noise spike. The time delay 320 imposes a delay on the applied NMR signal such that the delayed NMR signal produced on its output 325 coincides with the delay imposed by the noise detector 340. Although in the conventional noise filter (or TNS system) discussed in the Background of the Invention, the desired time delay can be provided through the use of a bandpass filter that is tuned to pass only the NMR signals, the new noise filter 300 typically does not employ such a bandpass filter as the time delay 320. That is, preferably the one or more time delay devices employed by the new noise filter 300 are not frequency sensitive in order to pass only the NMR signals.

Referring still to FIG. 3, both the time delayed NMR signal and the noise indicating signal are applied to a blanking circuit 330. The blanking circuit 330 is a gallium-arsenide semiconductor switch which is turned off by the noise indicating signal on line 345 to block any short-duration noise which is contained in the NMR imaging signal on output 325 to produce a noise-free signal at an output 350. A characteristic of this switch of blanking circuit 330 is that it does not generate appreciable energy at frequencies near the Larmor frequency when it is operated. Since the noise spikes are short in duration and the blanking periods are correspondingly short, it has been discovered that this method of removing noise spikes from the NMR signal does not produce objectional image artifacts. Indeed, as long as the blanking period is less than one sample period of the A/D converter 209, the image artifacts are negligible, even when it occurs during the acquisition of a view in central k-space. The blanking period should be as short as possible while still of sufficient duration to cover the noise spike. Thus, because of its simplicity and cost effectiveness, blanking out the noise is preferred over the other corrective methods such as interpolation or adding the inverse of the noise to the NMR signal.

Figure 4:
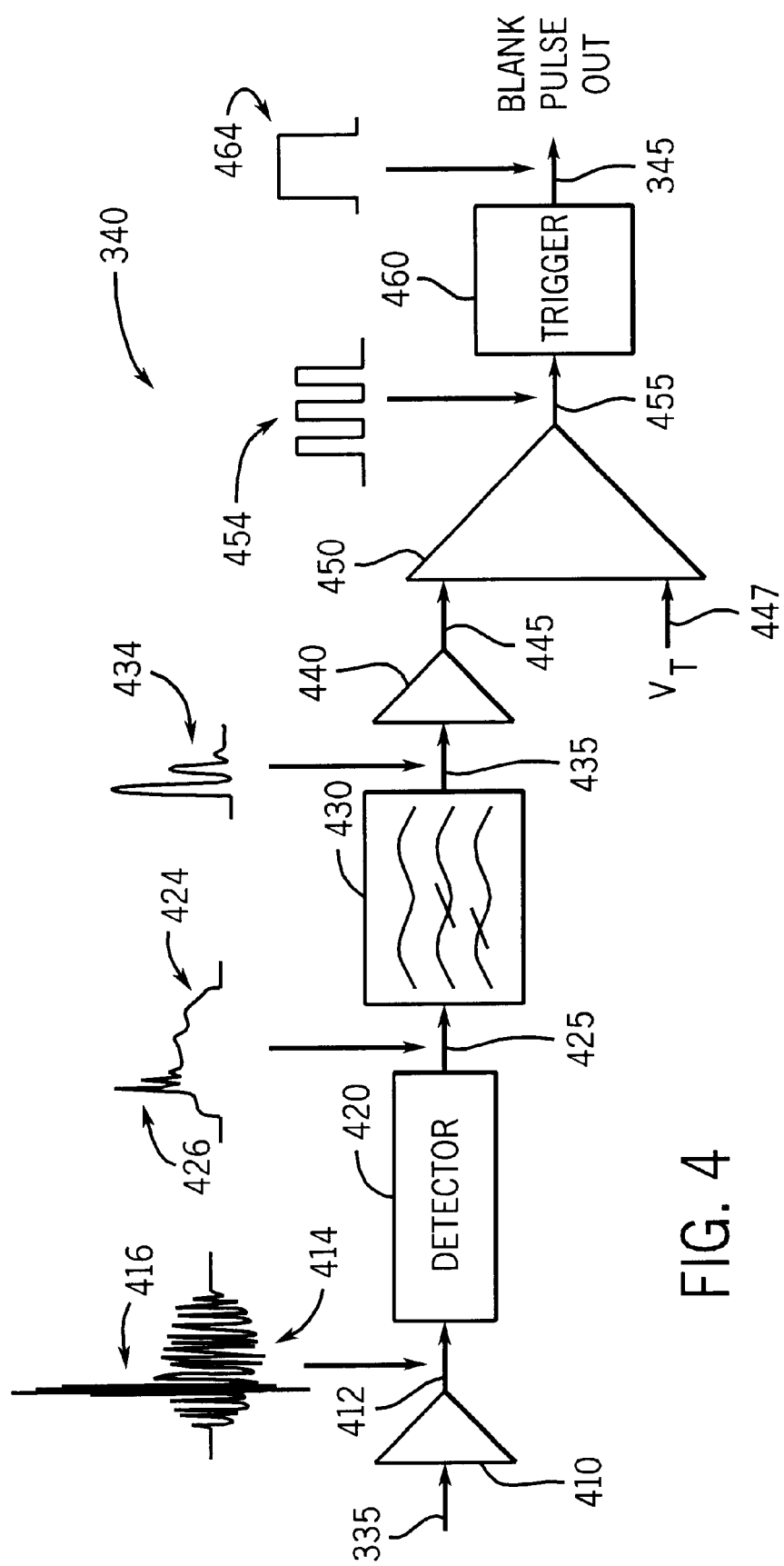
FIG. 4 is an electrical block diagram of a noise detector which forms part of the TNS system of FIG. 3.

Referring particularly to FIG. 4, the noise detector 340 includes an amplifier 410, an envelope detector 420, a high-pass filter 430, a second amplifier 440, a comparator 450 and a trigger 460. The NMR signal provided via the line 335 is amplified by the amplifier 410, which outputs an amplified NMR signal 412. In certain embodiments where the magnitude of the NMR signal is already at a desired level, the amplifier 410 is not required. The amplified NMR signal 412 typically is made up of a carrier signal (at the frequency of the RF carrier signal discussed above, e.g., the Larmour frequency) that is modulated by a modulation signal such that the signal 412 has an envelope, as shown in an exemplary signal fragment 414. The received modulation frequency (or frequencies) of the amplified NMR signal 412 is typically not identical to the transmitted modulation frequency imposed by the modulator and up converter 202 discussed above, since the modulation of the signal in part reflects the characteristics of the patient being scanned and as well as other operational factors.

Also, as shown by the signal fragment 414, the amplified NMR signal 412 sometimes includes one or more noise spikes 416. The amplified NMR signal 412 is provided to the envelope detector 420, which determines the envelope of the amplified NMR signal 412 and provides an envelope signal 425 indicative of that envelope. In one embodiment, the envelope detector 420 can be one of the model 8306, 8309 or 8310 Logarithmic Amplifiers manufactured by Analog Devices, Inc. of Norwood, Mass. However, the design of the envelope detector 420 can be any one of a number of designs currently known to those skilled in the art including, for example, a half-wave rectifier with an output terminal that is connected to ground by way of a capacitor. As shown in an exemplary signal fragment 424, the envelope signal 425 generally conforms to the envelope determined by the received modulation frequency but further includes noise spikes 426 corresponding to the noise spikes 416.

The envelope signal 425 is provided to the high-pass filter 430, which filters out the low-frequency components of the envelope signal. Because the frequencies that are associated with the noise spikes 426 in the envelope signal 425 are much higher than the frequencies associated with the envelope itself (e.g., the received modulation frequency), the high-pass filter 430 is able to filter out virtually all of the components of the envelope signal other than the signal components associated with the noise spikes 426. The high-pass filter 430 can be designed to have the desired pass band utilizing any one of a number of conventional filter design techniques known to those skilled in the art. In alternate embodiments, the high-pass filter 430 can be replaced by other types of filters so long as the replacement filters still filter out the received modulation frequency signal components associated with the NMR imaging information, without filtering out all of the noise spike signal components.

The output of the high-pass filter 430 therefore is a filtered envelope signal 435 including, for the most part, only signal components corresponding to the noise spikes 416, as shown in an exemplary signal fragment 434. Thus, by way of the process of envelope detection and subsequent filtering, a signal essentially indicative of only the noise spikes 416 is generated. This filtered envelope signal 435 is in turn provided to the second amplifier 440, which in turn amplifies the filtered envelope signal 435 to provide a comparator input signal 445 to the comparator 450. The second amplifier 440 may not be required in alternate embodiments where the signal strength of the filtered envelope signal 435 is already within desired levels.

The magnitude of the comparator input signal 445 is compared with the magnitude of a noise reference 447 by the comparator 450. The comparator 450, which can be an operational amplifier, operates as a threshold detector; that is, the comparator determines whether the comparator input signal 445 exceeds the noise reference 447, which is a noise threshold or DC voltage threshold ($V_T$). The noise reference 447 is a function of the "noise floor" for the particular system, receiver coil, subject and NMR pulse sequence being used. The noise reference 447 is set to a magnitude that is greater than the noise floor when no short-duration noise spikes are occurring. This level can be set manually during the set-up and calibration of the MRI system 100 and altered automatically as a function of the receive coil and the pulse sequence selected by the operator. The comparator input signal 445 can include a DC offset.

The comparator 450 produces a noise indication signal 455 that pulses on when the comparator input signal 445 exceeds the noise reference 447, as shown in a signal fragment 454. This noise indication signal 455 is provided to a trigger 460 (or monostable multi-vibrator or "monoshot"). The trigger 460 operates to output pulses on line 345, as shown by a signal fragment 464. The widths of the pulses vary in dependence upon the widths of the pulses of the noise indication signal 455. The pulses output by the trigger 460, however, only take on widths that are multiples of a fixed width (duration) determined by a time constant circuit that is coupled to (or part of) the trigger. The trigger 460 in some embodiments is enabled by a DATA IN window signal (not shown) that controls data acquisition. Because short-duration noise is known to be produced by a number of system transitions that occur when data is not acquired, the use of the DATA IN window signal insures that only those noise events that occur during image data acquisition are registered. A counter (not shown) is also coupled to the trigger 460, in some embodiments, to count and store the total number of registered noise events that have occurred. This number can be periodically read by maintenance personnel and used to evaluate system performance.

The new noise detector 340 of FIG. 4 is implemented as part of the new noise filter 300 (or TNS system) in MRI system 100 in place of a conventional noise detector as discussed above. The new noise detector 340, unlike the conventional noise detector, allows for broad band detection of transient spike noise, as follows. As discussed, the conventional noise detector must be carefully configured so that the bandstop filter of the noise detector does not pass signals in the NMR imaging frequency band. The NMR imaging frequency band includes frequencies in the range extending approximately from the RF carrier minus the received modulation frequency to the RF carrier plus the received modulation frequency. The signals in the NMR imaging frequency band are removed by the bandstop filter so that spike noise, which exists in a broader range of frequencies above and below the NMR imaging frequency band, can be distinguished from the NMR imaging information and thus detected.

In contrast, the new noise detector 340, by detecting the envelope of the NMR signals, effectively down-converts the information in the NMR imaging frequency band and removes the RF carrier. That is, signal components in the NMR imaging frequency band around the RF carrier are converted to the much lower frequency range extending from 0 Hz up to approximately the received modulation frequency (e.g., 1 MHz). Thus, the resulting envelope signal 425 effectively includes, in addition to spike noise at a wide range of frequencies, only low-frequency signal components corresponding to the NMR imaging information. Because of this down-conversion of the NMR signals, the range of frequencies at which there is no NMR imaging information only exists above the frequency range defined by the received modulation frequency, as opposed to both above and below the NMR imaging frequency band. Consequently, the noise detector 340 employs the high-pass filter 430 in place of a bandstop filter.

Because the spike noise includes a range of frequency components extending to frequencies well beyond the received modulation frequency, the stop band of the high-pass filter 430 does not need to be as carefully tailored to the frequency range of the received modulation signal components as the stop band of the bandstop filter is tailored to the NMR imaging frequency band in the conventional system. For example, in typical MRI systems, the RF carrier frequency can range from 8 MHz to 200 MHz, and the received modulation frequency band around the carrier frequency can vary from a bandwidth of 150 KHz to a bandwidth of 1 MHz. Although spike noise generally can include a broad frequency band, for example, ranging from 0 Hz all the way to 1 GHz, the operation of the receiver coil 152 and preamplifier 153 tend to narrow the spike noise frequency band around the carrier frequency, for example, a 10 MHz band.

Consequently, for effective operation, the conventional noise filter (discussed in the Background of the Invention) with its bandstop filter needs to be able to filter out the 150 KHz to 1 MHz modulation frequency band centered about the appropriate RF carrier frequency, without overly attenuating the spike noise signal components outside that band. Given that even minor changes in the design or implementation of MRI systems (particularly changes which affect the polarizing field $B_0$) can result in significant changes in the RF carrier frequency at which the received modulation frequency band is centered, the bandstop filter must be carefully configured/tuned with respect to each MRI system to guarantee proper operation of the noise filter.

In contrast, the high-pass filter 430 of the new noise detector 340 typically needs to be configured only so that its stop band includes the received modulation frequency band after the amplified NMR signal 412 is down-converted by the envelope detector 420. As noted, this frequency band of the envelope or received modulation signal (after down-conversion) typically extends from 0 Hz to somewhere in the range of 150 KHz to 1 MHz (depending upon the embodiment). Because the frequencies of the signal components of the spike noise can extend up to 10 MHz, the stop band of the high-pass filter 430 can extend significantly higher than 1 MHz. At the same time, because the envelope signal 425 is down-converted from the RF carrier frequency, the stop band of the high-pass filter 430 does not have to coincide with (or otherwise account for) the RF carrier frequency.

The new noise filter 300 is therefore much less frequency sensitive than the conventional noise filter. A single configuration of the new noise filter 300 with a particular high-pass filter 430 can be employed in a variety of MRI systems having a variety of RF carrier frequencies or modulation frequencies, or in individual MRI systems that operate at multiple frequencies. The new noise filter 300 allows for broad band detection of transient noise spikes insofar as it is capable of detecting transient noise spikes for MRI systems having RF carrier frequencies or modulation frequencies within broad bands of frequencies.

There are numerous variations that can be made from the preferred embodiment without departing from the spirit of the invention. The noise detector 340 can be placed at other locations in the NMR signal path and its noise indication signal can be employed in other ways to ameliorate the effects of short-duration noise spikes. For example, the noise detector 340 can be connected between the RF receive coil and the pre-amp 153. Instead of blanking or correcting the NMR signal in its analog form, the noise indication signal could also be employed, in alternate embodiments, to correct the acquired NMR data in its digital form. This same noise indication signal can be used to "time stamp" the acquired NMR data so that it can be altered later in the image reconstruction process, or the noise indication signal can be used to alter the scan sequence. For example, if a noise spike is detected while acquiring a view from the central region of k-space, the view acquisition order can be altered to reacquire that view at a later time in the scan.

Other variations are possible. For example, circuitry can be added to protect amplifiers and other components from over voltage and over current conditions. Rather than being fixed, the noise reference level can be controlled by an automatic gain circuit that adjusts the level as a function of NMR noise power. Further, rather than simply blanking out the noise spike, other signal correction methods are possible. For example, a negative impulse might be inserted into the NMR signal coincident with the noise spike to offset its effects, or a sample and hold circuit might be employed to apply the signal sample just prior to the noise spike during the detected noise spike interval. The NMR signal can be passed through a variable bandwidth, bandpass filter, and the noise indication signal employed to constrict the bandwidth to a fraction of the signal bandwidth. Yet another correction method is to capture the NMR signal carrier frequency prior to the noise spike with a phase locked loop, and to insert a signal of this frequency into the gap formed by the blocked noise spike.

While the foregoing specification illustrates and describes the preferred embodiments of this invention, it is to be understood that the invention is not limited to the precise construction herein disclosed. The invention can be embodied in other specific forms without departing from the spirit or essential attributes of the invention. Accordingly, reference should be made to the following claims, rather than to the foregoing specification, as indicating the scope of the invention.

What is claimed is:

1. In a magnetic resonance imaging system, a method of processing a magnetic resonance signal including transient spike noise, the method comprising:
    receiving an initial signal related to the magnetic resonance signal, the initial signal including a carrier signal modulated by a modulation signal and further including a transient spike noise component;
    determining an envelope signal indicative of an envelope of the initial signal, such that the envelope is indicative of the modulation signal and further indicative of the transient spike noise component;
    filtering the envelope signal by way of a high-pass filter to remove information relating to the modulation signal from the envelope signal and to produce a high-pass filtered envelope signal indicative of the transient spike noise component;
    comparing a comparison signal related to the filtered envelope signal with a threshold to produce a noise indication signal, wherein the comparing occurs subsequent to the filtering; and
    modifying the magnetic resonance signal based upon the noise indication signal.

2. The method of claim 1, further comprising:
    amplifying the magnetic resonance signal at an amplifier in order to produce the initial signal.

3. The method of claim 1, further comprising:
    amplifying the filtered envelope signal to produce the comparison signal.

4. The method of claim 1, wherein the noise indication signal includes pulses that occur whenever the comparison signal is determined to exceed the threshold, and wherein widths of the pulses are reflective of widths of spikes in the transient spike component of the initial signal.

5. The method of claim 4, further comprising:
    providing the noise indication signal to a trigger, which in turn produces output pulses having pulse widths equaling multiples of a predetermined pulse width in dependence upon the widths of the pulses of the noise indication signal.

6. The method of claim 5, wherein the output pulses of the trigger are provided to a blanking circuit that receives a delayed magnetic resonance signal equaling the magnetic resonance signal as delayed by a time delay element.

7. The method of claim 6, wherein the blanking circuit nullifies portions of the delayed magnetic resonance signal that temporally correspond to the output pulses.

8. The method of claim 6, wherein the blanking circuit replaces portions of the delayed magnetic signal that temporally correspond to the output pulses with alternative signals.

9. The method of claim 1, wherein the threshold is a DC voltage.

10. In a magnetic resonance imaging system, a method of processing a magnetic resonance signal including transient spike noise, the method comprising:
    receiving an initial signal related to the magnetic resonance signal, the initial signal including a carrier signal modulated by a modulation signal and further including a transient spike noise component;
    determining an envelope signal indicative of an envelope of the initial signal, such that the envelope is indicative of the modulation signal and further indicative of the transient spike noise component;
    filtering the envelope signal by way of a high-pass filter to remove information relating to the modulation signal from the envelope signal and to produce a high-pass filtered envelope signal indicative of the transient spike noise component, wherein the filtering of the envelope signal occurs after the determining of the envelope signal without substantial processing of the envelope signal occurring in between the determining and high-pass filtering of the envelope signal; and
    processing the magnetic resonance signal based upon the filtered envelope signal.

11. In a magnetic resonance imaging system, a system for processing a magnetic resonance signal having a transient spike noise component, the system comprising:
    an envelope detector that receives an initial signal related to the magnetic resonance signal and provides an envelope signal in response to the initial signal,
    a high-pass filter that is coupled to the envelope detector, receives the envelope signal and provides a high-pass filtered envelope signal in response to the envelope signal, wherein the high-pass filter isolates signal components corresponding to transient spike noise in the initial signal from signal components corresponding to magnetic resonance imaging information in the initial signal;
    a comparison device that is coupled to the high-pass filter, the high-pass filter being coupled in between the comparison device and the envelope detector, wherein the comparison device receives a comparison signal related to the filtered envelope signal and provides a noise indication signal based upon the filtered envelope signal; and
    a modification device that is coupled to the comparison device and modifies the magnetic resonance signal based upon the noise indication signal, in order to reduce the transient spike noise component in the magnetic resonance signal and produce an improved magnetic resonance signal.

12. The system of claim 11, wherein the comparison device is a threshold detector including an operational amplifier, and wherein the comparison device provides the noise indication signal based upon a comparison of a level of the comparison signal with a level of a threshold signal also provided to the comparison device.

13. The system of claim 11, further comprising a first amplifier coupled to the envelope detector that receives the magnetic resonance signal and provides the initial signal in response to the magnetic resonance signal, and a second amplifier coupled to the high-pass filter that receives the filtered envelope signal and provides the comparison signal in response to the filtered envelope signal.

14. The system of claim 11, wherein the modification device includes a trigger that receives the noise indication signal and provides an output signal including output pulses in response to the noise indication signal.

15. The system of claim 14, wherein the comparison device outputs high-level pulses when the comparison device determines the comparison signal to exceed a threshold, wherein the comparison device outputs a low-level signal at other times, and wherein the output pulses of the output signal provided by the trigger have output pulse widths that are multiples of a predetermined pulse width, the output pulse widths varying in correspondence to widths of the high-level pulses received from the comparison device.

16. The system of claim 15, wherein the modification device includes a time delay device that delays the magnetic resonance signal to account for time delays in processing the magnetic resonance signal to obtain the output signal of the trigger.

17. The system of claim 16, wherein the modification device includes a blanking circuit that reduces portions of the delayed magnetic resonance signal that correspond to the output pulses of the output signal of the trigger, in order to produce the improved magnetic resonance signal.

18. The system of claim 17, wherein the reduction of the portions of the delayed magnetic resonance signal includes nullification of those portions of the delayed magnetic resonance signal.

19. The system of claim 11, wherein the envelope detector effectively down-converts the initial signal so that the envelope signal includes, in addition to signal components corresponding to transient spike noise, signal components corresponding to magnetic resonance imaging information, and wherein the envelope detector includes a logarithmic amplifier.

20. A magnetic resonance imaging system comprising:

an operator console;

a computer system coupled to the operator console and including a memory;

a system control coupled to the computer system and including a transceiver; and a magnet assembly coupled to the system control that produces varying magnetic fields as determined by the system control;

wherein the transceiver receives a magnetic resonance signal from the magnet assembly, detects an envelope of an initial signal related to the magnetic resonance signal to produce an envelope signal, high-pass filters the envelope signal to isolate a transient spike noise component of the envelope signal and produce a high-pass filtered envelope signal indicative of the transient spike noise component, and processes the magnetic resonance signal based upon the filtered envelope signal to eliminate transient spike noise from the magnetic resonance signal and to produce an improved magnetic resonance signal, wherein the high-pass filtering of the envelope signal occurs after the producing of the envelope signal without substantial processing of the envelope signal occurring in between the producing and high-pass filtering of the envelope signal.

* * * * *

UNITED STATES PATENT AND TRADEMARK OFFICE
CERTIFICATE OF CORRECTION

PATENT NO.     : 6,529,000 B2
DATED          : March 4, 2003
INVENTOR(S)    : Lou It is certified that error appears in the above-identified patent and that said Letters Patent is hereby corrected as shown below:

Column 1,
Line 21, "field B.)" should read -- field $B_1$) --.

Column 2,
Line 62, "of systems" should read -- of MRI systems --.

Column 4,
Line 58, "separate MRI system" should read -- separate system --.

Signed and Sealed this

Fourteenth Day of October, 2003

JAMES E. ROGAN
*Director of the United States Patent and Trademark Office*